US006657214B1

(12) United States Patent
Foegelle et al.

(10) Patent No.: US 6,657,214 B1
(45) Date of Patent: Dec. 2, 2003

(54) SHIELDED ENCLOSURE FOR TESTING WIRELESS COMMUNICATION DEVICES

(75) Inventors: Michael D. Foegelle, Cedar Park, TX (US); Kefeng Liu, Round Rock, TX (US); Zhong Chen, Ft. Collins, CO (US); Bryan H. Sayler, Cedar Park, TX (US)

(73) Assignee: EMC Test Systems, L.P., Austin, TX (US)

( * ) Notice: Subject to any disclaimer, the term of this patent is extended or adjusted under 35 U.S.C. 154(b) by 469 days.

(21) Appl. No.: 09/595,732

(22) Filed: Jun. 16, 2000

(51) Int. Cl.[7] .............................................. H01Q 17/00
(52) U.S. Cl. ................ 250/506.1; 250/505.1; 250/496.1; 250/453.1; 250/515.1; 333/212; 333/227; 333/228; 333/229; 333/230; 333/231; 333/232
(58) Field of Search ..................... 250/496.1, 497.1, 250/498.1, 503.1, 505.1, 506.1, 515.1; 333/212, 227, 228, 229, 230, 231, 232

(56) References Cited

U.S. PATENT DOCUMENTS

| | | | | |
|---|---|---|---|---|
| 4,939,446 A | * | 7/1990 | Rogers | 324/72 |
| 5,134,405 A | * | 7/1992 | Ishihara et al. | 342/1 |
| 5,237,283 A | * | 8/1993 | Carbonini | 324/627 |
| 5,530,412 A | * | 6/1996 | Goldblum | 333/232 |
| 5,805,667 A | * | 9/1998 | Alvarez et al. | 379/1 |
| 6,204,825 B1 | * | 3/2001 | Wilz | 343/841 |
| 6,230,105 B1 | * | 5/2001 | Harris et al. | 702/57 |

FOREIGN PATENT DOCUMENTS

| | | | | |
|---|---|---|---|---|
| JP | 09236628 | * | 9/1997 | G01R/31/00 |
| JP | 09318689 | * | 12/1997 | G01R/31/00 |
| JP | 1019951 | * | 1/1998 | G01R/29/10 |
| JP | 1078465 | * | 3/1998 | G01R/31/00 |

* cited by examiner

Primary Examiner—John R. Lee
Assistant Examiner—David A. Vanore
(74) Attorney, Agent, or Firm—Christopher J. Rourk; Akin Gump Strauss Hauer & Feld, LLP

(57) ABSTRACT

A test system having a shielded enclosure and common air interface for testing the transmit and receive functionality of wireless communication devices such as mobile phones. A test system according to the present invention provides improved fault coverage by permitting robust testing of the entire signal path of a wireless device, including the antenna structure. In one embodiment of the invention, an RF-shielded enclosure having a test chamber is provided. The structure of the shielded enclosure blocks ambient RF energy from entering the test chamber and interfering with testing operations. The shielded enclosure may be lined with an RF absorbing material to improve test repeatability. A novel test antenna structure is disposed in the test chamber for wirelessly communicating test signals to a device under test. The test antenna is designed to maximize coupling with the antenna(s) of one or more types of wireless devices, while also minimizing variations in test measurements that might result from the particularized location of batteries or processing circuitry within such devices. The test antenna is coupled to an RF connector that provides a connection point for an external test set functioning as a base-station simulator for use in testing all or a subset of the features of the device under test. The test antenna may be formed on a printed circuit board. In one such embodiment, the elements of the test antenna are formed on a printed circuit board, with the element nearest the antenna of the device under test formed on the side of the circuit board nearest the device under test. The remainder of the test antenna is formed on the opposite side of the printed circuit board.

22 Claims, 7 Drawing Sheets

SHIELDED ENCLOSURE FOR TESTING WIRELESS COMMUNICATION DEVICES

FIELD OF THE INVENTION

The present invention relates generally to testing of wireless devices; and, more particularly, it relates to a shielded test system providing a common air interface for testing transmit and receive functionality of such devices.

BACKGROUND OF THE INVENTION

The last few years have witnessed a worldwide proliferation of wireless communication devices. The ever-increasing number of these devices has resulted in an array of practical problems, particularly in the areas of deployment and testing. For example, wireless service providers often subsidize all or a portion of the cost of the mobile phones used by its network subscribers. If a particular phone does not perform to customer expectations, the service provider may attempt to return the phone to the manufacturer. If the manufacturer responds that the phone is operational, the service provider may be forced to absorb the subsidized portion of the cost of the phone. Accordingly, the service provider may desire to perform its own tests on a questionable phone in order to verify that it meets manufacturer performance specifications.

A number of such tests may be performed by the service provider. These tests generally verify the transmit and receive functionality of mobile phones, and often include signal degradation tests wherein a relatively low power test signal is provided to a phone to test its error handling capabilities in low-power environments. Also frequently performed are maximum transmission power level tests in which the transmission power of a phone under test is compared to that of a known good phone in order to verify that the levels are approximately the same. These types of tests may also be performed at the manufacturer's site prior to shipment of phones to distributors.

To aid in testing, most mobile phones include a digital interface and/or test port for programming and testing certain of the electronic functionality. In addition, an analog test port is often provided for testing a phone's transmit and receive functionality of a phone. In a typical mobile phone test environment, one or both of these test ports is physically coupled to a mobile/cellular radio test set via a direct cable connection. The phone under test may be enclosed in an RF-shielded environment in order to prevent ambient RF signals from interfering with the test data communicated over the direct cable connection.

However, prior test environments and methods for testing mobile phones suffer from a number of shortcomings. In particular, the aforementioned manufacturer tests bypass the antenna structure of the phone. Thus, the prior test solutions frequently do not detect problems that may exist in the electrical pathway between the antenna structure and other electrical components (e.g., transceiver amplifier circuitry).

In addition to bypassing the antenna structure, the direct connection method may also add up to several dB of loss to test measurements. Further, the cables that couple mobile phones to a test set are susceptible to breakage over time. Traditional test environments also do not permit repeatable and predictable testing of a wide variety of phone types having differing antenna structures.

SUMMARY OF THE INVENTION

Briefly, the present invention relates to a test system having a shielded enclosure and common air interface for testing the transmit and receive functionality of wireless communication devices. A test system according to the present invention provides improved fault coverage over prior solutions by permitting robust testing of the entire signal path of a mobile phone, including the antenna structure. The test system is configurable to accommodate a wide variety of phone types having differing heights and antenna structures.

In one embodiment of the invention, an RF-shielded enclosure having a test chamber is provided. The structure of the shielded enclosure impedes (i.e., reflects or absorbs) ambient RF energy from interfering with testing operations. The shielded enclosure may be lined with an RF absorbing material to improve test repeatability.

A test novel antenna structure is disposed in the test chamber for wirelessly communicating test signals to a device under test. The test antenna structure is designed to maximize coupling with the antenna(s) of one or more types of mobile phones or other wireless devices, while also minimizing variations in test measurements that might result from the particularized location of batteries or processing circuitry within such devices. The test antenna structure is coupled to an RF connector that provides a connection point for an external test set while maintaining shield integrity. The test set may function as a base-station simulator for use in testing all or a subset of the features of the device under test. A variety of exemplary test antenna configurations are disclosed.

The test antenna structure may be formed on a printed circuit board. In one such embodiment, the element(s) of the test antenna nearest the antenna of the device under test is formed on the side of the circuit board nearest the device under test. The remainder of the test antenna is formed on the opposite side of the printed circuit board to minimize any dependence of test measurements on battery location. A clamp assembly is also disposed in the test chamber for maintaining a device under test in a repeatable communicative relationship with the test antenna.

By providing for wireless communication of test signals with minimal transmission losses, a test system according to the present invention is able to test the entire signal path of a mobile phone, including the antenna, in a repeatable manner. In addition to mobile phones, the test system may be used for testing other types of wireless communication devices, as well as other devices requiring an RF-shielded test environment.

BRIEF DESCRIPTION OF THE DRAWINGS

A better understanding of the present invention can be obtained when the following detailed description of an exemplary embodiment is considered in conjunction with the following drawings, in which.

DETAILED DESCRIPTION OF THE INVENTION

Figure 1:
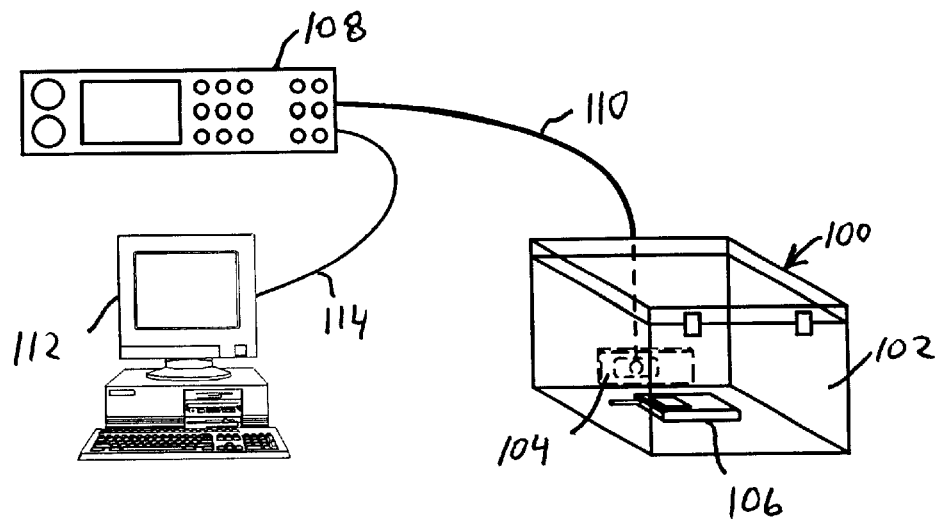
FIG. 1 is a block diagram of an exemplary test environment according to the present invention.

FIG. 1 is a block diagram of an exemplary test environment according to the present invention. The test environment utilizes a test system 100 to test, for example, the transmit and receive functionality of wireless communication devices. The test system 100 provides improved fault coverage over prior solutions by permitting the robust and expedient testing of the entire signal path of a communication device such as a mobile phone 106 without a direct cable connection. The test system 100 may be configured to accommodate a wide variety of wireless devices while maintaining efficient communication of test signals.

Referring more specifically to FIG. 1, the test system 100 of the disclosed embodiment of the invention is comprised of a shielded enclosure 102 that forms a test chamber for receiving a device under test, such as the mobile phone 106. A test antenna 104 is also disposed in the test chamber for wirelessly communicating test signals to and/or from the mobile phone 106. A test set 108 (such as the HP 8924 manufactured by Hewlett-Packard Corporation/Agilent Technologies) is communicatively coupled to the test antenna 104 via an RF cable 110. The RF cable 110 is coupled to the test antenna 104 by an RF connector such as that described below in conjunction with FIG. 5.

The test set 108 functions to communicate test signals to and from the test antenna 104 for purposes of testing all or a subset of the features of the mobile phone 106. Test set 108 is generally configurable to simulate a mobile phone base-station. A computing device 112 may also be coupled to the test set 108 via a cable 114 or other type of data connection. The computing device 112 is utilized to analyze data collected by the test set 108 in order to determine if a particular device under test is performing to the manufacturer's specifications.

A test system 100 according to the present invention is also useful for applications where an RF-isolated environment is required for making immunity or emission measurements. Such applications include design qualification, post production sampling, quality control/quality assurance, incoming material qualification, repair bays, etc.

Although the disclosed embodiment of the invention is generally described in the context of testing mobile phones 106, it will be appreciated that other types of devices may also be analyzed by the test system 100. Such devices include, but are not limited to, cellular phones, pagers, electronic sub-assemblies, circuit cards, integrated circuits, discrete components, etc. For example, devices compliant with wireless networking standards, such as the Bluetooth or Home RF standards, may be tested in a test system 100 according to the present invention.

Figure 2:
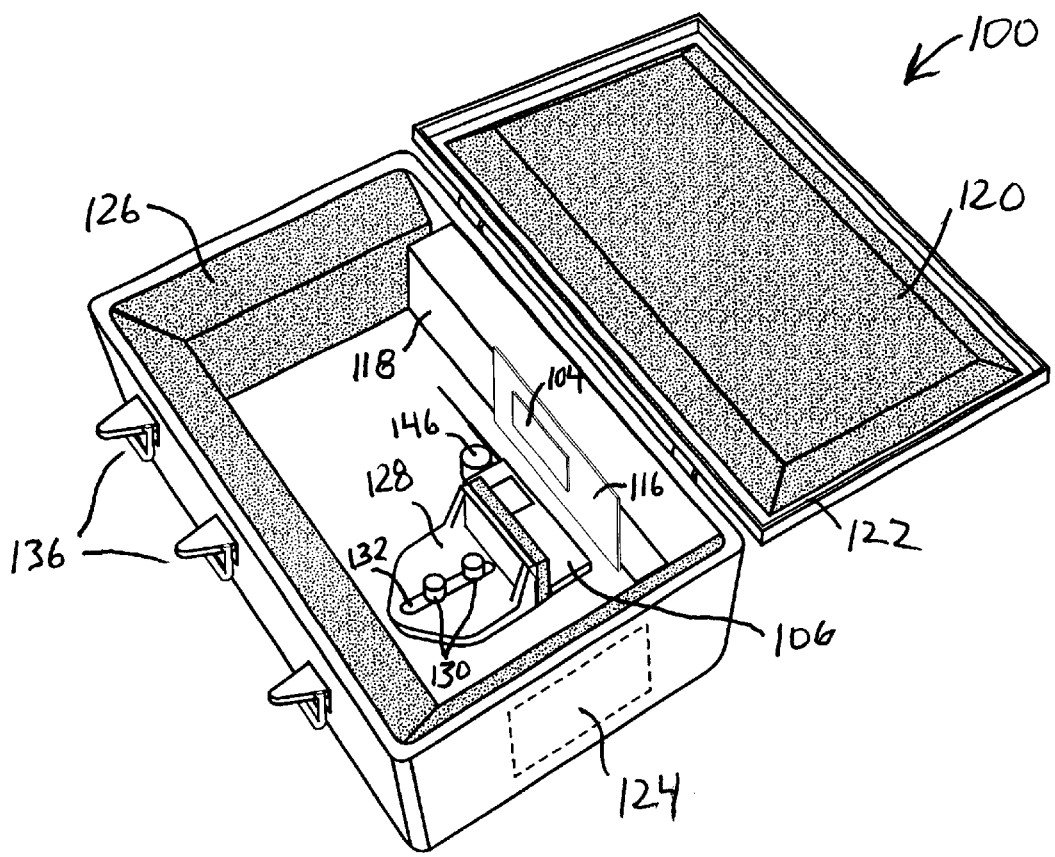
FIG. 2 is a perspective view of an exemplary test system according to the present invention.

FIG. 2 is a perspective view of an exemplary test system 100 according to the present invention. In this embodiment of the invention, the test antenna 104 is formed on a printed circuit board 116. The use of a printed circuit board 106 provides a low cost solution for the test antenna assembly, and may be easily replaced with other antenna assemblies (if necessary) for use with different types of wireless devices. The antenna assembly formed of the printed circuit board 116 and test antenna 104 is supported by antenna backing structure 118 that may be formed of a non-metallic material such as Styrofoam or styrene.

The shielded enclosure 102 may be formed of aluminum or any other material (e.g., copper or steel) capable of providing suitable isolation at the relevant frequencies. Such materials provide shielding effectiveness of 60 dB and higher, thereby improving test repeatability. In the disclosed embodiment, the shielded enclosure 102 is generally rectangular in shape and comprises a top portion or lid 120 that is movable between a sealed position and an open position. The lid 120 includes a compressible EMI gasket 122 disposed around the inside perimeter for sealing the lid 120 when it is in a closed position. The compressible EMI gasket 122 aids creating a contiguous RF shield.

The shielded enclosure 102 may also include at least one sealable opening 124 for use in an automated test environment wherein a mobile phone 106 or other device may be mechanically positioned in the shielded enclosure 102 via the sealable opening 124. In one contemplated embodiment of the invention, the shielded enclosure 102 is configured for use with a conveyor belt (not shown) that rapidly positions wireless devices within the test chamber. In this embodiment of the invention, labyrinth or similar type of isolation may be necessary to provide the appropriate level of isolation during testing.

In the disclosed embodiment of the invention, the shielded enclosure 102 is lined with an RF-absorbent material 126. The RF-absorbent material 126 minimizes RF reflections internal to the shielded enclosure 102. The RF absorbing material 126 may also eliminate nulls and hot spots within the shielded enclosure 102. Various types of RF-absorbent materials may be utilized, including, for example, carbon-loaded polyurethane or polystyrene foam, ferrite tile, ferrite-loaded (lossy) rubber, or other such material. The RF absorbing material 126 of the disclosed embodiments provides at least 10–20 dB of return loss at the relevant operating frequencies.

An mounting base or adjustable clamping assembly 128 and alignment post 146 are also provided in the test chamber of the shielded enclosure 102 to permit repeatable and secure orientation of a mobile phone 106 with respect to the test antenna 104. The adjustable clamp assembly 128 of the illustrated embodiment is a sliding clamp having fasteners 130 that permit movement along a slot 132. The clamp assembly 128 may be formed of nylon or other type of suitable material that does not interfere with RF signaling. The adjustable clamp assembly 128 may also include markings to permit an operator to position mobile phones 106 in an identical manner for purposes of comparative testing. The shielded test enclosure 102 includes a plurality of quick release latches 136 for securely closing the lid 120 during testing operations.

Figure 3:
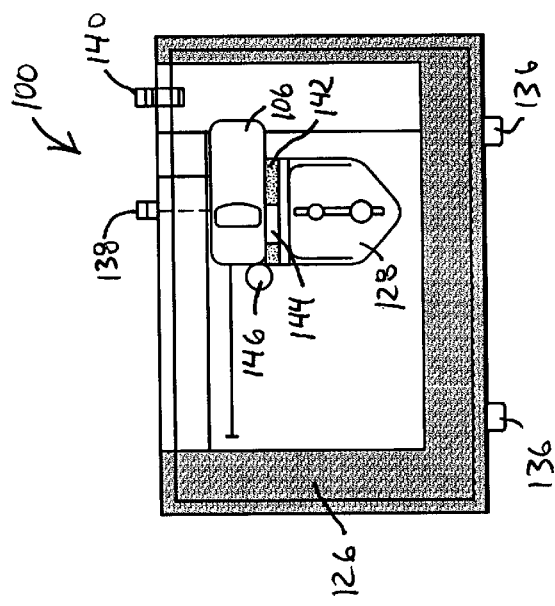
FIG. 3 is a sectional top view of the exemplary test system of FIG. 2.

FIG. 3 is a sectional top view of the exemplary test system 100 of FIG. 2. As illustrated in this view, an external RF connection 138 is provided for establishing a wired connection between the test antenna 104 and the test set 108. The external RF connection may be a Type-N, SMA, or similar connector, for use with a cable such as a semi-rigid or flexible coaxial cable. Further, an optional Type-N connector feed-through 140 may be provided for traditional direct connection testing of the mobile phone 106.

A padding material 142 is disposed between the clamping assembly 128 and the mobile phone 106 to prevent damage to the mobile phone 106. The padding material 142 may include a slot 144 for permitting ready access to the on/off switch of certain mobile phones 106. An alignment post 146 is also provided in the disclosed embodiment to aid in securely positioning the mobile phone 106.

Figure 4:
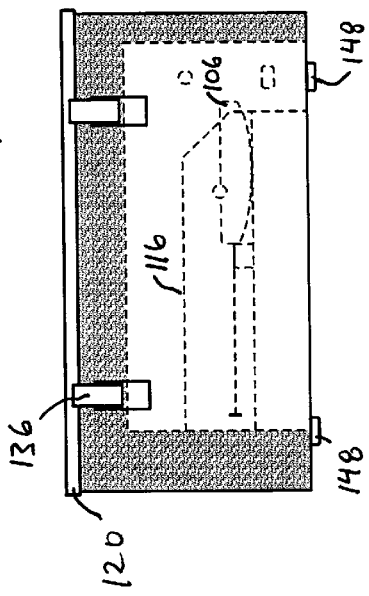
FIG. 4 is a sectional front view of the exemplary test system of FIG. 2.

FIG. 4 is a sectional front view of the exemplary test system 100 of FIG. 2. This view illustrates a contemplated positioning of the circuit board 116 (on which the test antenna 104 is formed) with respect to a mobile phone 106. As discussed in greater detail below, the printed circuit board 116 and test antenna 104 are appropriately positioned such that maximum effective coupling of test signals is achieved between the test antenna 104 and the antenna of the mobile phone 106. The test system 100 may also include a plurality of feet 148, manufactured of a material such as neoprene, to prevent damage to surfaces on which the test system 100 is placed.

Figure 5:
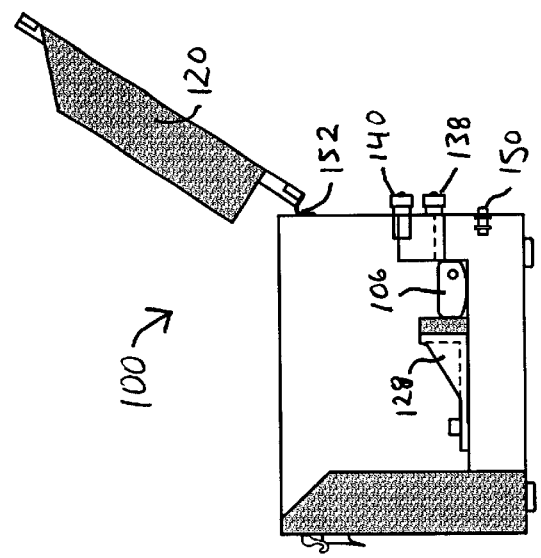
FIG. 5 is a sectional side view of the exemplary test system of FIG. 2.

FIG. 5 is a sectional side view of the exemplary test system 100 of FIG. 2. The test system 100 of this embodiment of the invention includes a cable connection 150 for accommodating more advanced test procedures. The cable connection 150 may comprise, for example, a 9-pin filtered D-sub connector.

A continuous hinge 152 is provided to permit movement of the lid 120 between an open position and a closed position. The continuous hinge 152 also provides additional rigidity to the shielded enclosure 102 to ensure a tight RF seal with the compressible EMI gasket 122 when the lid 120 is in a closed position. As shown in FIG. 4, it is desirable that the RF-absorbent material 126 of the lid 120 make contact with the RF-absorbent material 126 of the remainder of the shielded enclosure 100.

Figure 6:
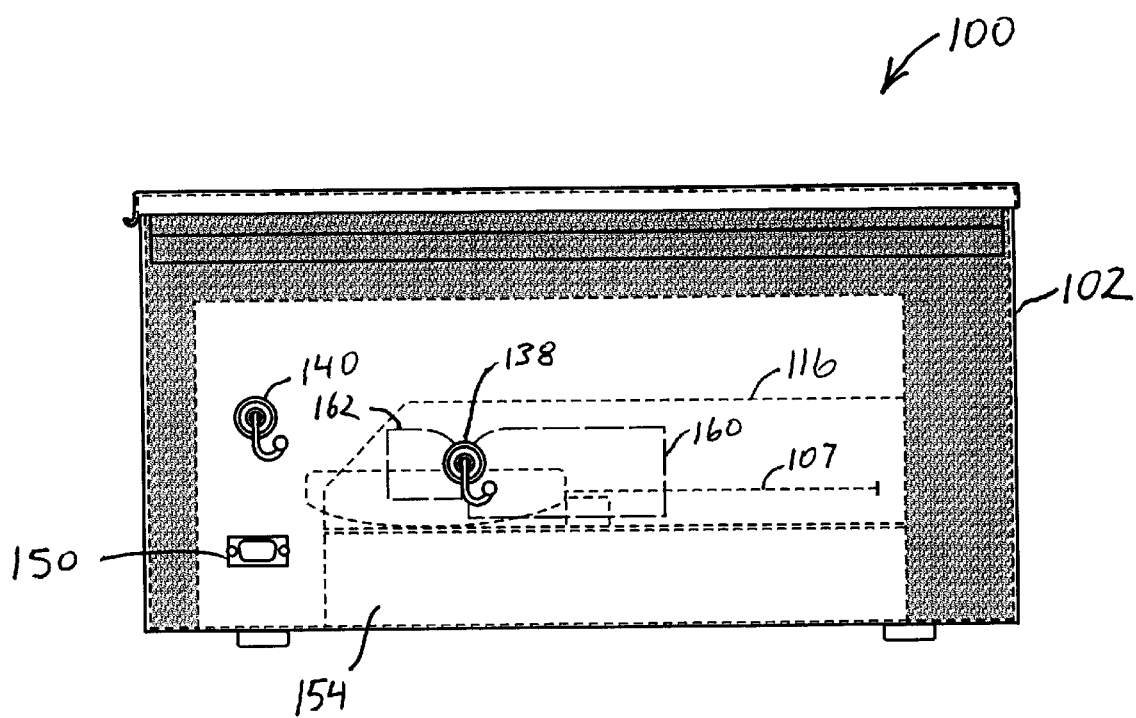
FIG. 6 is a sectional back view of the exemplary test system of FIG. 2.

FIG. 6 is a sectional back view of the exemplary test system 100 of FIG. 2. As illustrated in this view, a support structure 154 is provided for supporting the mobile phone 106 and clamping assembly 128. As with the antenna backing material 118, the support structure 154 may be formed of a material such as Styrofoam or styrene. Antenna elements 160 and 162 of the test antenna 104 are shown in one contemplated arrangement with the mobile phone 106. This particular embodiment of the test antenna 104 is described more fully below in conjunction with FIGS. 8 and 9. A substantial portion of the antenna element 160 is in relatively close proximity to the antenna 107 of the mobile phone 106 for wirelessly communicating test signals. The antenna elements 160 and 162 are coupled at a common feed point 164 (FIG. 9), that is in turn coupled to the external RF connection 138.

In addition, a test port 158 of the mobile phone 106 is illustrated. As described above, the test port 158 may be used in conjunction with the feed-through 140 to provide a direct, wired connection to the mobile phone 106.

Figure 7:
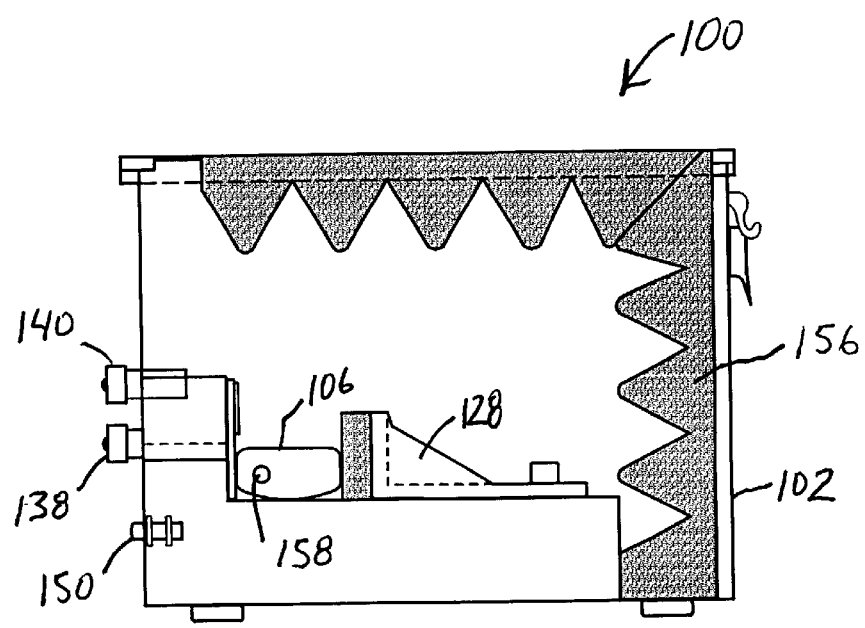
FIG. 7 is a sectional side view of an alternate embodiment of a test system according to the present invention.

FIG. 7 is a sectional side view of an alternate embodiment of a test system 100 in accordance with the present invention. In this embodiment, a pyramidal or curvilinear absorbing material 156 is utilized instead of the RF-absorbent material 126. Alternatively, it is contemplated that a flat laminate material or any similar type of structure that is useful for broadband reflection suppression (such as those described above) could be utilized as an RF absorber. The precise nature of the RF absorbing liner is not considered critical to the invention.

FIGS. 8–13 are various views of alternate exemplary embodiments of test antenna structures for use by the test system of FIG. 2. These test antenna structures are of the disclosed embodiments are formed on a relatively low cost printed circuit board 116. The printed circuit board 116 may be formed of standard fiberglass and conductive materials.

In the embodiments of FIGS. 8–12, the antenna element located nearest the body of the mobile phone 106 is located on the back side of the printed circuit board 106 to minimize any dependence of test measurements on the location of a battery or other circuitry within a mobile phone 106. Although the elements of the test antennas 104 of the illustrated embodiments are formed on opposite sides of a printed circuit board 116, it is contemplated that the test antenna may be wholly formed on one side of a printed circuit board 116, or formed as an integral part of the shielded enclosure 102. Printed circuit board antennas may include stripline slots, printed circuit board dipoles, and microstrip patches.

In general, the illustrated embodiments of the test antenna should provide a coupling coefficient resulting in a relatively flat response over a frequency range of 700 MHz to 2 GHz in order to operate with a variety of wireless communication standards. Alternatively, the antenna elements of the coupling board may be optimized for performance at a wide variety of specific frequency ranges, such as 800–900 MHz, 1750–1850 MHz and 2400–2500 MHz.

As known to those skilled in the art, the region immediately surrounding an antenna, in which the active components predominate, is known as the reactive near-field region. The size of this region varies for different antennas. For many antennas, however, the outer limit of the reactive near-field region is on the order of a few wavelengths or less. Beyond the reactive near-field region, the radiating field predominates. The radiating region is typically divided into two subregions, the radiating near-field region and the far-field region. In the radiating near-field region, the usual radiation pattern is dependent on the distance from the antenna. In general, the antennas 104 described herein operate in either the reactive near-field region or the radiating near-field region, although operation in the far-field region is also possible in a relatively large shielded enclosure 102.

Figure 8:
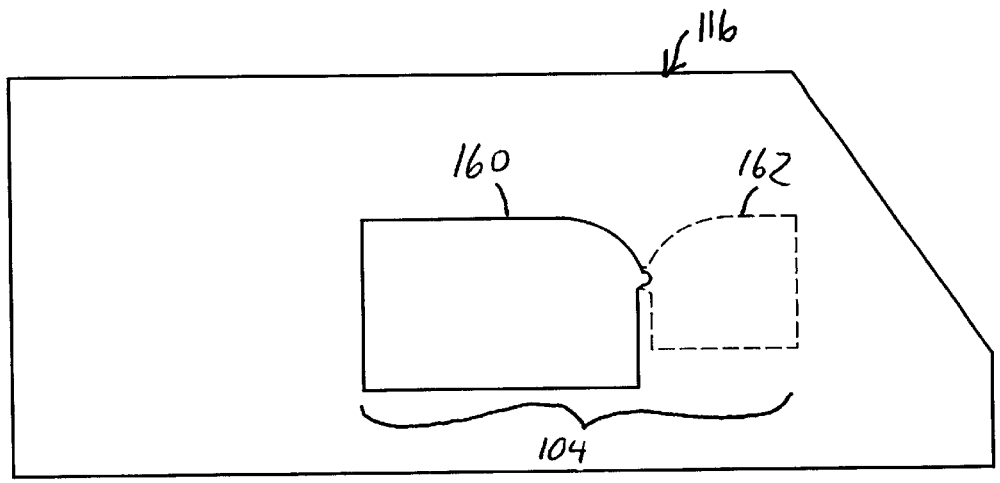
FIGS. 8–13 are various views of alternate exemplary embodiments of antenna structures for use by the test system of FIG. 2.
Figure 9:
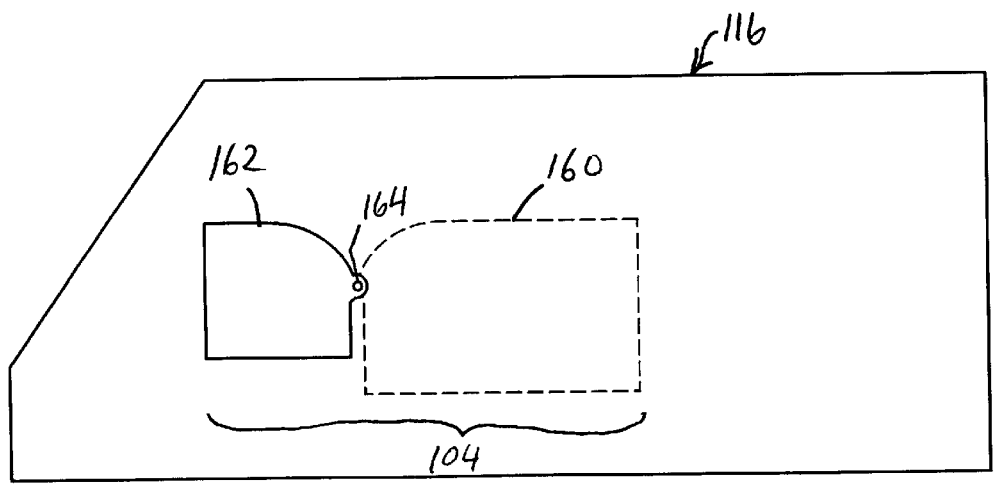

Referring more specifically to FIGS. 8 and 9, front and back views are shown for a test antenna 104 formed of antenna elements 160 and 162. This embodiment of the test antenna 104 is designed to maximize coupling with the antenna(s) of one or more types of mobile phones or other wireless devices, while also minimizing variations in test measurements that might result from the particularized location of batteries or processing circuitry within such devices.

The antenna elements 160 and 162 are asymmetric, and are coupled by an RF feedline 164. In this embodiment, both the antenna elements 160 and 162 have a parabolic-shaped portion nearest the RF feedline 164, and are otherwise generally rectangular-shaped. The element 162 has a reduced area, and is placed nearest the body of a mobile phone 106 but on the side of the printed circuit board 116 farthest away from the mobile phones 106.

In particular, some mobile phones 106 have metal battery packs, while others do not. Further, the location of battery packs depends on the model of mobile phone 106 being examined. The asymmetrical design of the antenna elements 160 and 162 functions to reduce any dependence of test measures on battery location. In one contemplated embodiment, the antenna element 160 has a surface area of approximately 4.0 square inches, while the antenna element 162 has a surface area of approximately 1.3 square inches.

Figure 10:
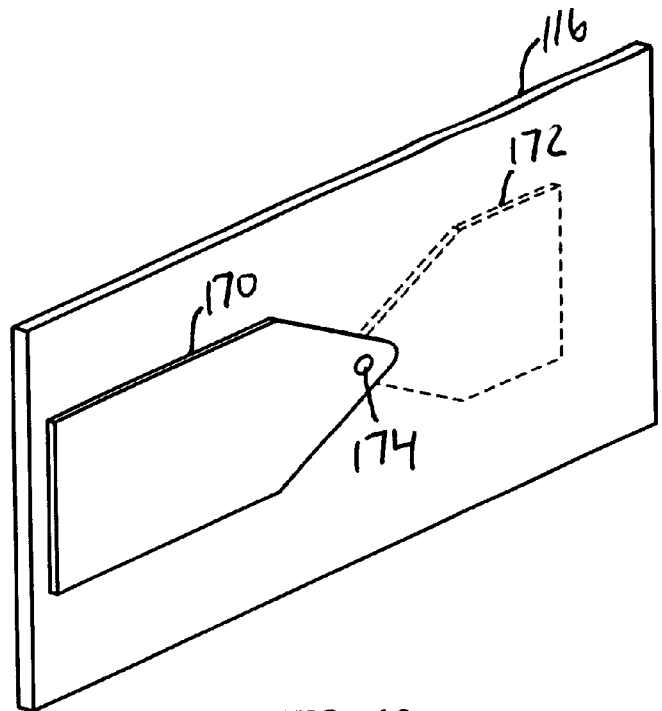
Figure 11:
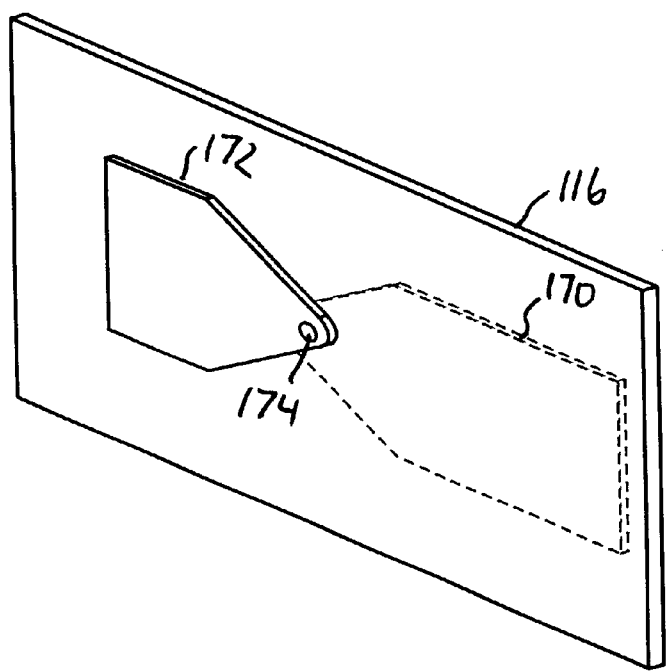

FIGS. 10 and 11 show front and back perspective views of an alternate embodiment of the test antenna 104. In this embodiment, antenna elements 170 and 172 are formed in a bow-tie type arrangement, and are coupled at an RF feedline 174. The antenna element of 170 (located nearest the antenna of a device under test) is longer than the antenna element 172, although the elements 170 and 172 are vertically symmetric.

Figure 12:
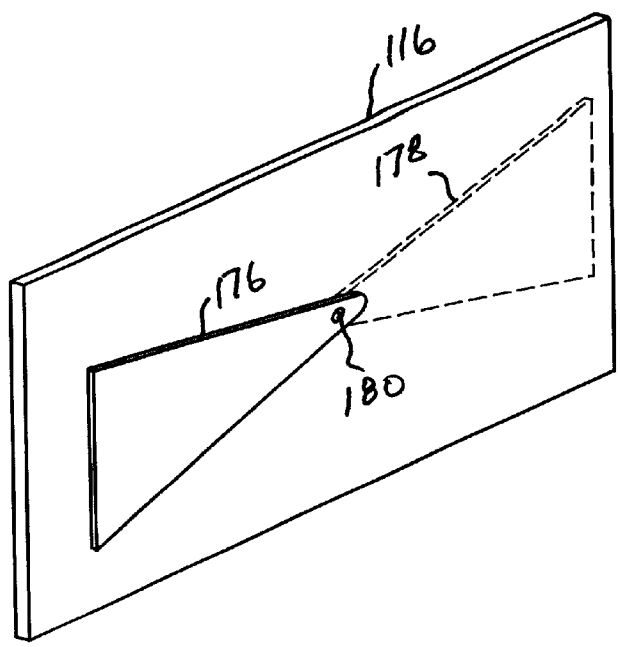

FIG. 12 is a perspective view of another alternate embodiment of the test antenna 104. In this embodiment, symmetric antenna elements 176 and 178 are arranged in a bow-tie manner, and are coupled by an RF feedline 180.

Figure 13:
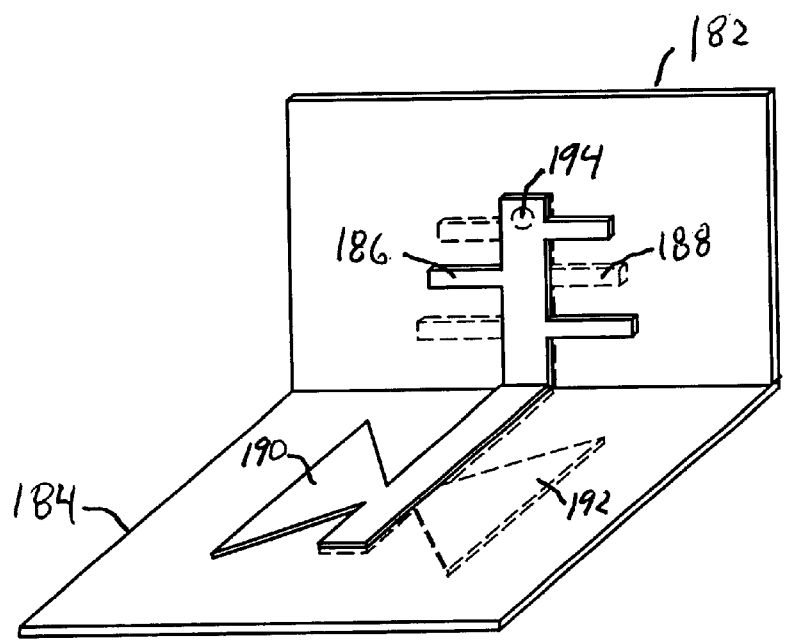

FIG. 13 is a perspective view of yet another alternate embodiment of the test antenna 104. This embodiment includes a log-periodic dipole array having antenna elements 186 and 188 formed on opposite sides of a first printed circuit board 182. The dipole array operates in conjunction with a biconical-type structure having antenna elements 190 and 192 formed on opposite sides of a second printed circuit board 184. As used herein, the term "log-periodic" is used to refer to an antenna designed with a structure that is periodic in the logarithm of some normalized dimensions. Care must be exercised in the design of such antennas because the substrates thickness may limit performance at upper frequencies.

Figure 14:
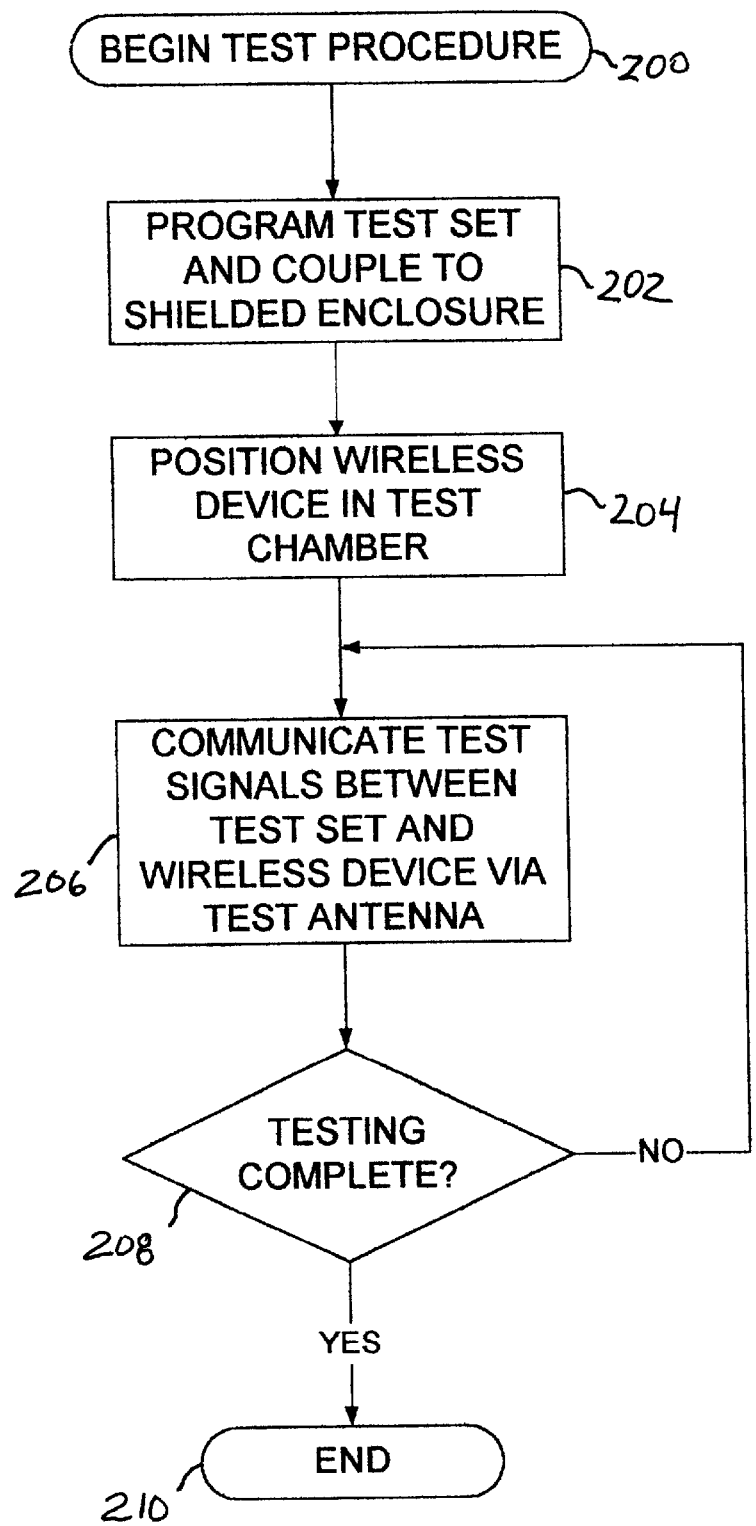
FIG. 14 is a flow diagram of an exemplary test methodology utilizing a test system in accordance with the present invention.

FIG. 14 is a flow diagram of an exemplary test methodology utilizing a test system 100 in accordance with the present invention. The described methodology may be performed in a test environment comprising a shielded enclosure such as that illustrated in FIG. 1.

Following commencement of the test procedure in step 200, the test set is programmed in step 202 to perform the desired tests on a wireless device being examined. The test set is also coupled to the shielded enclosure 100, either prior to or subsequent to the programming step, such that it is able to receive signals from the test antenna 104. Next, in step 204, the wireless device is positioned in the test chamber of the shielded enclosure 100. More particularly, the wireless device is positioned such that it is able to communicate with the test antenna 104.

Next, in step 206, the test set communicates in a programmed manner with the wireless device via the test antenna 104. This step may include manual intervention wherein the shielded enclosure is opened and a user depresses certain buttons on the wireless device. In another embodiment, a push rod may be provided to allow buttons to be depressed without opening the shielded enclosure 102. In yet another embodiment, a window or camera system may be provided for observing the display of a wireless device and/or button depressions. A stethoscope or intercom may also be used for audio testing purposes.

Testing continues until it is determined in step 208 that testing has been completed. The test is then concluded at step 210.

Thus, a test system having a shielded enclosure and novel test antenna for testing the transmit and receive functionality of wireless communication devices has been described. The test system provides improved fault coverage over prior solutions by permitting robust testing of the entire signal path of a mobile phone, including the antenna structure. The test system is configurable to accommodate a wide variety of phone types having differing heights and antenna structures.

In view of the above detailed description of the present invention and associated drawings, other modifications and variations will now become apparent to those skilled in the art. It should also be apparent that such other modifications and variations may be effected without departing from the spirit and scope of the present invention.

We claim:

1. A test system for testing wireless and other devices, comprising:
    a shielded enclosure forming a test chamber for receiving a device under test;
    an antenna having one or more elements disposed in the test chamber for wirelessly communicating test signals to and/or from a device under test; and
    a printed circuit board, at least one element of the antenna formed on the printed circuit board.

2. The test system of claim 1, the antenna comprising at least a first antenna element and a second antenna element, both the first and second antenna elements formed on the printed circuit board.

3. The test system of claim 2, wherein the first element and second element are asymmetric.

4. The test system of claim 2, the first and second antenna elements formed on opposite sides of the printed circuit board.

5. The test system of claim 4, the first antenna element having a greater surface area than the second antenna element, the second antenna element disposed on the side of the printed circuit board furthest away from the area of the test chamber used to receive a device under test.

6. The test system of claim 2, the antenna having an RF feedline, the first and second antenna elements having a parabolic shaped portion nearest the RF feedline, the first and second antenna elements having generally rectangular shaped distal ends.

7. The test system of claim 2, the first and second antenna elements formed in a bow-tie arrangement.

8. The test system of claim 1 wherein the antenna comprises a dipole antenna.

9. The test system of claim 1 wherein the antenna comprises a bi-conical dipole antenna.

10. The test system of claim 1, the antenna having a coupling coefficient providing a relatively flat response over a frequency range of approximately 700 megahertz to 2 gigahertz.

11. A test system for testing wireless and other devices, comprising:
    a shielded enclosure forming a test chamber for receiving a device under test;
    an antenna having one or more elements disposed in the test chamber for wirelessly communicating test signals to and/or from a device under test; and
    a clamp assembly, disposed in the test chamber, for maintaining a device under test in a communicative relationship with the antenna.

12. The test system of claim 11, further comprising:
    an RF cable connection disposed on the periphery of the shielded enclosure for coupling the antenna to an external signal analyzer/generator,
    a printed circuit board, at least one element of the antenna formed on the printed circuit board.

13. The test system of claim 11, further comprising:
    a cable connection for providing a direct cable connection to a device under test.

14. The test system of claim 11, further comprising:
    an RF-absorbent material lining a substantial portion of the test chamber.

15. The test system of claim 11, wherein the shielded enclosure substantially isolates the test chamber from external RF energy.

16. The test system of claim 11, wherein the shielded enclosure is generally rectangular in shape, and comprises a top portion movable between a sealed position and an open position.

17. The test system of claim 11, wherein the shielded enclosure comprises at least one sealable opening for use in an automated test environment, wherein a device under test is mechanically positioned in the shielded enclosure via the sealable opening.

18. A test environment for testing wireless and other devices, comprising:

a shielded enclosure forming a test chamber;

an antenna disposed in the test chamber for wirelessly communicating test signals to and/or from a device under test;

a cable communicatively coupled to the antenna; and a printed circuit board, at least one element of the antenna formed on the printed circuit board.

19. The test environment of claim 18, further comprising:

a test set communicatively coupled to the antenna via the cable, the test set analyzing and/or generating signals communicated between the antenna and a device under test.

20. The test environment of claim 19, further comprising:

a computer coupled to the test set, the computer configurable to perform analytical operations on data generated by the test set.

21. The test environment of claim 19, the antenna comprising at least a first antenna element and a second antenna element, the first and second antenna elements formed on opposite sides of the printed circuit board.

22. A method for testing wireless and other devices, comprising:

providing a test system, the test system comprising a shielded enclosure forming a test chamber, the test system further comprising a test antenna disposed in the test chamber;

coupling a test set to the test system such that the test set is able to receive signals from and provide signals to the test antenna;

positioning a wireless device in the test chamber such that the wireless device is communicatively coupled to the test antenna;

communicating test signals between the test set and the wireless device via the test antenna; and wherein the test antenna comprises at least a first antenna element and a second antenna element, the first and second antenna elements formed on opposite sides of a printed circuit board.

\* \* \* \* \*